United States Patent
Chang et al.

(10) Patent No.: US 9,716,044 B2
(45) Date of Patent: Jul. 25, 2017

(54) INTERLAYER DIELECTRIC STRUCTURE WITH HIGH ASPECT RATIO PROCESS (HARP)

(75) Inventors: Jen-Chi Chang, Hsinchu (TW);
Chun-Li Lin, Hsinchu (TW);
Kai-Shiung Hsu, Kaohsiung (TW);
Ming-Shiou Kuo, Taichung (TW);
Wen-Long Lee, Hsinchu (TW);
Po-Hsiung Leu, Lujhu Township, Taoyuan County (TW); Ding-I Liu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 282 days.

(21) Appl. No.: 13/212,904

(22) Filed: Aug. 18, 2011

(65) Prior Publication Data
US 2013/0043539 A1   Feb. 21, 2013

(51) Int. Cl.
*H01L 21/8238*   (2006.01)

(52) U.S. Cl.
CPC ............ *H01L 21/823807* (2013.01); *H01L 21/823814* (2013.01); *H01L 21/823864* (2013.01); *H01L 21/823871* (2013.01)

(58) Field of Classification Search
CPC ..... H01L 21/823807; H01L 21/823871; H01L 21/823864; H01L 21/823814

USPC ........ 257/298, 369, 384, E29.255, E21.585, 257/E27.098, E29.128, E29.264
See application file for complete search history.

(56) References Cited

U.S. PATENT DOCUMENTS

| | | | |
|---|---|---|---|
| 2006/0094215 A1* | 5/2006 | Frohberg et al. | 438/592 |
| 2006/0113568 A1* | 6/2006 | Chan et al. | 257/204 |
| 2006/0160314 A1* | 7/2006 | Arghavani | 438/285 |
| 2007/0212847 A1* | 9/2007 | Ingle et al. | 438/407 |
| 2008/0237662 A1* | 10/2008 | Liao et al. | 257/288 |
| 2009/0194817 A1* | 8/2009 | Lee et al. | 257/369 |
| 2009/0246927 A1* | 10/2009 | Wiatr et al. | 438/305 |
| 2010/0038692 A1* | 2/2010 | Chuang et al. | 257/298 |
| 2010/0311231 A1* | 12/2010 | Thei et al. | 438/587 |
| 2012/0032238 A1* | 2/2012 | Teo et al. | 257/288 |

* cited by examiner

*Primary Examiner* — Selim Ahmed
(74) *Attorney, Agent, or Firm* — Haynes and Boone, LLP

(57) ABSTRACT

The present disclosure provides a method of making an integrated circuit. The method includes forming a gate stack on a semiconductor substrate; forming a stressed contact etch stop layer (CESL) on the gate stack and on the semiconductor substrate; forming a first dielectric material layer on the stressed CESL using a high aspect ratio process (HARP) at a deposition temperature greater than about 440 C to drive out hydroxide (OH) group; forming a second dielectric material layer on the first dielectric material layer; etching to form contact holes in the first and second dielectric material layers; filling the contact holes with a conductive material; and performing a chemical mechanical polishing (CMP) process.

20 Claims, 7 Drawing Sheets

INTERLAYER DIELECTRIC STRUCTURE WITH HIGH ASPECT RATIO PROCESS (HARP)

BACKGROUND

In advanced integrated circuit technology, device dimensions are scaled down. Especially, after the gate stacks are formed, the interlayer dielectric material is difficult to fill in the gaps between the gate stacks due to the high aspect ratio of the gaps and gap-filling capability of the existing process. Although various deposition technologies are employed to form interlayer dielectric (ILD) with improved gap-filling capability, the top surface of the ILD is still uneven, resulting in tungsten residue left on the surface of the ILD after the tungsten plugs are formed in the ILD. Therefore, an interlayer dielectric structure and a method making the same are needed to address the above issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
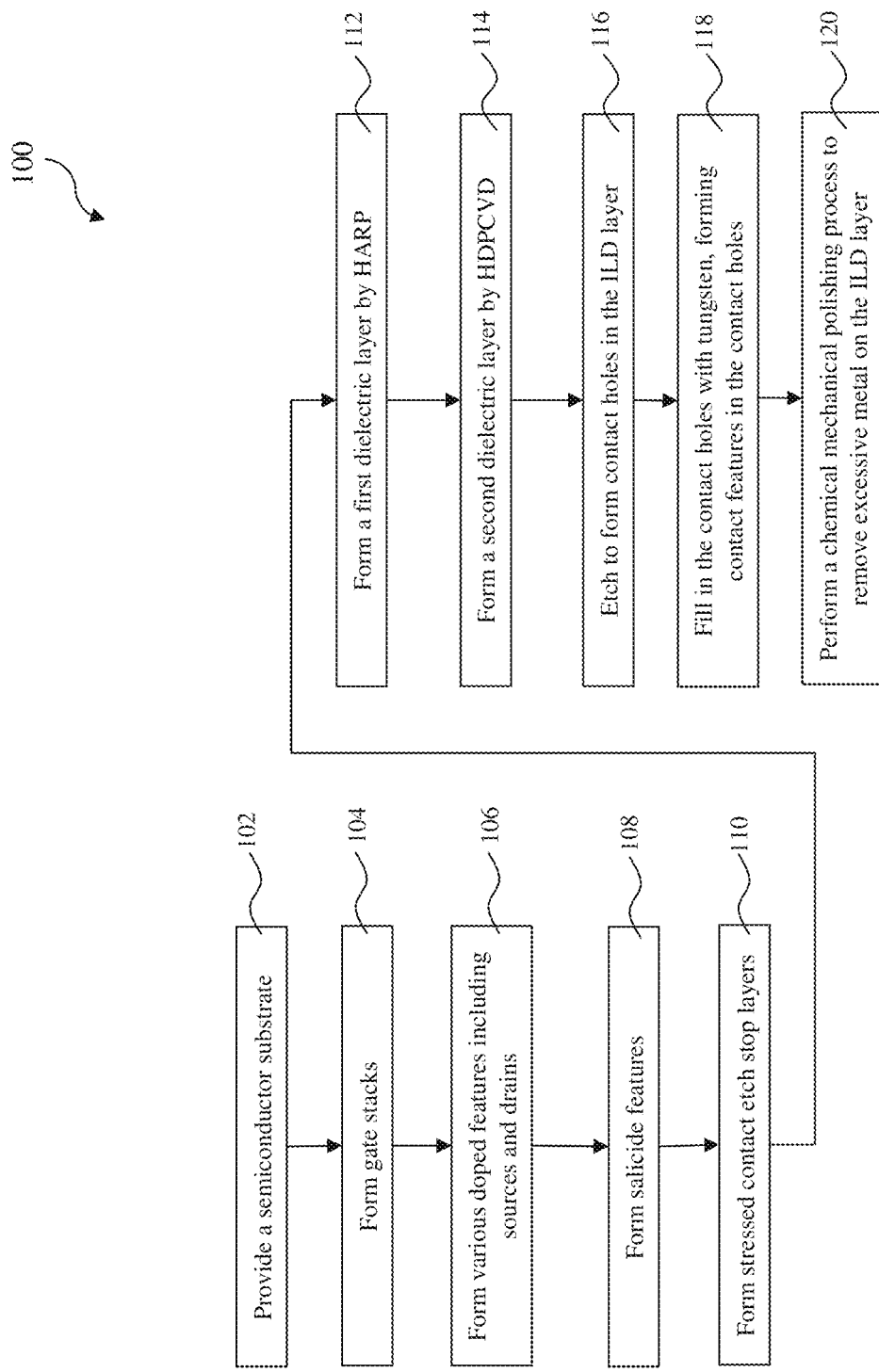
FIG. 1 is a flowchart of a method making a semiconductor structures constructed according to various aspects of the present disclosure in one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 making a semiconductor structure constructed according to various aspects of the present disclosure in one or embodiments. FIGS. 2 through 7 are sectional views of a semiconductor structure 200 at various fabrication stages and constructed according to one or more embodiments. The semiconductor structure 200 and the method 100 of making the same are collectively described with reference to FIGS. 1 through 7.

Figure 2:
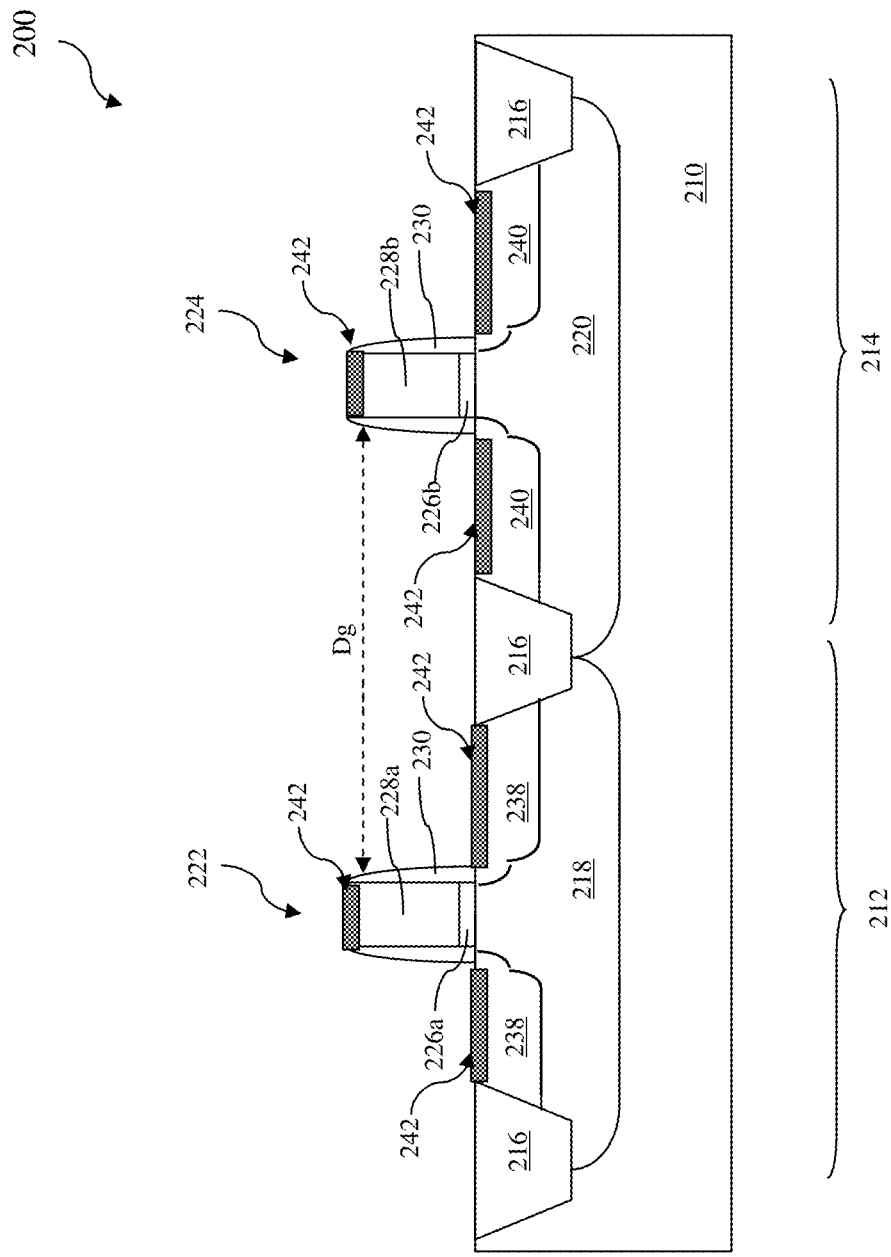
FIGS. 2-7 are sectional views of one embodiment of a semiconductor structure at various fabrication stages constructed according to various aspects of the present disclosure in one or more embodiments.

Referring to FIGS. 1 and 2, the method 100 begins at step 102 by providing a semiconductor substrate 210. The semiconductor substrate 210 includes silicon. Alternatively or additionally, the substrate includes germanium, silicon germanium or other proper semiconductor materials. The semiconductor substrate 210 also includes various isolation features, such as shallow trench isolation (STI), formed in the substrate to separate various devices. The semiconductor substrate also includes various doped regions such as n-well and p-wells. In one embodiment, the semiconductor substrate 210 includes a first region 212 for a p-type field-effect transistor (pFET) and a second region 214 for an n-type field-effect transistor (nFET). In one example, the pFET and nFET are metal-oxide-semiconductor field-effect transistors (MOSFETs). In one embodiment, the first region 212 includes an n-type well (n-well) and the pFET in the first region 212 is formed in the n-well. The second region 214 includes a p-type well (p-well) and the nFET in the second region 214 is formed in the p-well. In an alternative embodiment, the substrate 210 is n-type doped, the pFET in the first region 212 is directly formed in the substrate, the second region 214 includes a p-well, and the nFET is formed in the p-well. In another alternative embodiment, the substrate 210 is p-type doped, the nFET in the second region 214 is directly formed in the substrate, the first region 212 includes a n-well, and the pFET is formed in the n-well.

Various shallow trench isolation feature 216 are formed in the semiconductor substrate 210, such as disposed to separate first region 212 and the second region 214 for proper electrical isolation. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The method 100 proceeds to step 104 by forming a first gate stack 222 in the first region 212 and a second gate stack 224 in the second region 214. The first and second gate stacks 222/224 are configured with a gap therebetween. The gap between the first and second gate stacks 222/224 has a lateral distance Dg as illustrated in FIG. 2. The lateral distance Dg is getting smaller and smaller when progressed to advanced technology nodes, such as 45 nm. In one example, the distance Dg is less than about 800 angstrom. The gap filling is more challenging with the narrow gaps. The first gate stack 222 in the first region 212 and a second gate stack 224 in the second region 214 can be simultaneously formed in a same procedure. The first gate stack 222 includes a first gate dielectric feature 226a and a first gate electrode 228a stacked on the first gate dielectric feature 226a. The second gate stack 224 includes a second gate dielectric feature 226b and a second gate electrode 228b stacked on the second gate dielectric feature 226b.

In the present embodiment, various material layers, including a gate dielectric layer 226 and a gate electrode layer 228 are formed on the substrate 210 by various deposition technique. Then a lithography patterning process is applied to the various material layers to pattern thereof, forming the first and second gate stacks 222/224 including respective gate dielectric features (226a and 226b) and gate electrodes (228a and 228b). In one example, the gate dielectric layer 226 includes silicon oxide and the gate electrode layer 228 includes doped polysilicon. In another example, the gate dielectric layer 226 of silicon oxide is formed by a thermal oxidation process and the gate electrode layer 228 of polysilicon is formed by a chemical vapor deposition (CVD) method. An exemplary lithography patterning process may include photoresist patterning, etching, and photoresist stripping. The photoresist patterning may further include processing steps of photoresist coating, soft baking, mask aligning, exposing pattern, post-exposure baking, developing photoresist, and hard baking. Lithography patterning may also be implemented or replaced by other proper methods such as maskless photolithography, electron-beam writing, ion-beam writing, and molecular imprint.

In another alternative embodiment, the gate dielectric 226 may include a high-k dielectric layer. The high k dielectric layer includes a dielectric material having the dielectric constant higher than that of thermal silicon oxide, about 3.9. In one example, the high-k dielectric layer includes hafnium oxide (HfO). In various examples, the high-k dielectric layer includes metal oxide, metal nitride, or combinations thereof. In one embodiment, the gate electrode layer 228 includes metal, such as copper, aluminum or other suitable metal. In another embodiment, the gate stacks (e.g. 222 and 224) may further include a cap layer interposed between the high-k dielectric layer and gate electrode layer. In one example, the cap layer includes titanium nitride (TiN). In one embodiment, various gate stacks may further include gate spacers (or sidewall spacers) 230 disposed on the sidewalls of the corresponding gate electrodes and are formed at a later step.

In another embodiment, the first gate stack 222 and the second gate stack 224 can be formed separately in different procedures such that the first gate electrode 228a and the second gate electrode 228b include different conductive materials with respective tuned work functions for improved device performance. As noted early, the first gate stack 222 is configured for a pFET and the second gate stack 224 is configured for an nFET. In one embodiment, the first gate electrode 228a and the second gate electrode 228b include different conductive materials, such as metal and/or metal alloy, with the respective work functions individually tuned for enhanced device performance. For example, the first gate electrode 228a includes one or more conductive materials tuned to have a work function close to or greater than about 5.2 eV; and the second gate electrode 228b includes one or more conductive materials tuned to have a work function close to or less than about 4.2 eV. The gate stacks may be formed by gate-first process, gate-last process or high-k-last process according to various embodiments.

The method 100 proceeds to step 106 by forming various doped features in the semiconductor substrate 210, including sources and drains in the first region 212 and the second region 214. Source and drain 238 are formed in the first region 212 for the pFET by a proper technique, such as one or more ion implantations with a p-type dopant (e.g., boron). Similarly, source and drain 240 are formed in the second region 214 for the nFET by a similar process, such as one or more ion implantations with an n-type dopant (e.g., phosphor). In one embodiment, the source and drain features (238 and 240) further include light doped source/drain (LDD) features substantially aligned with the associated gate stack and heavily doped source/drain (S/D) features substantially aligned with associated sidewall spacers 230. In furtherance of the embodiment, taking the first gate stack 222 as an example, the LDD features are formed first by ion implantation with a light doping dose. Thereafter, the spacer 230 is formed by dielectric deposition and plasma etching. Then the heavily doped S/D features are formed by ion implantation with a heavy doping dose. The various source and drain features of the nFET and the pFET may be formed in a similar procedure but with opposite doping type.

Still referring to FIG. 2, the method 100 may proceed to step 108 by forming silicide features 242. In one embodiment, the silicide features 242 include nickel silicide. In an alternative embodiment, the silicide features include 242 may include other suitable silicide, such as cobalt silicide, tungsten silicide, tantalum silicide, titanium silicide, platinum silicide, erbium silicide, palladium silicide, or combinations thereof. The silicide features 242 are formed on various sources and drains in the first and second regions 212/214 for reduced contact resistance. The silicide features 242 may be additionally formed on the gate electrodes 228a and 228b when the gate electrodes 228a and 228b include polysilicon. The silicide features 242 are formed by a process known in the art such as self-aligned silicide (salicide) and therefore also referred to as salicide features 242. In the present embodiment, a metal layer is deposited on the substrate 210. A high temperature annealing process is applied to the substrate 210 and the metal layer such that the metal layer is reacted with silicon of the substrate 210 to form silicide. The un-reacted metal layer is then removed by an etching process, resulting the silicide features 242 as illustrated in FIG. 2.

Figure 3:
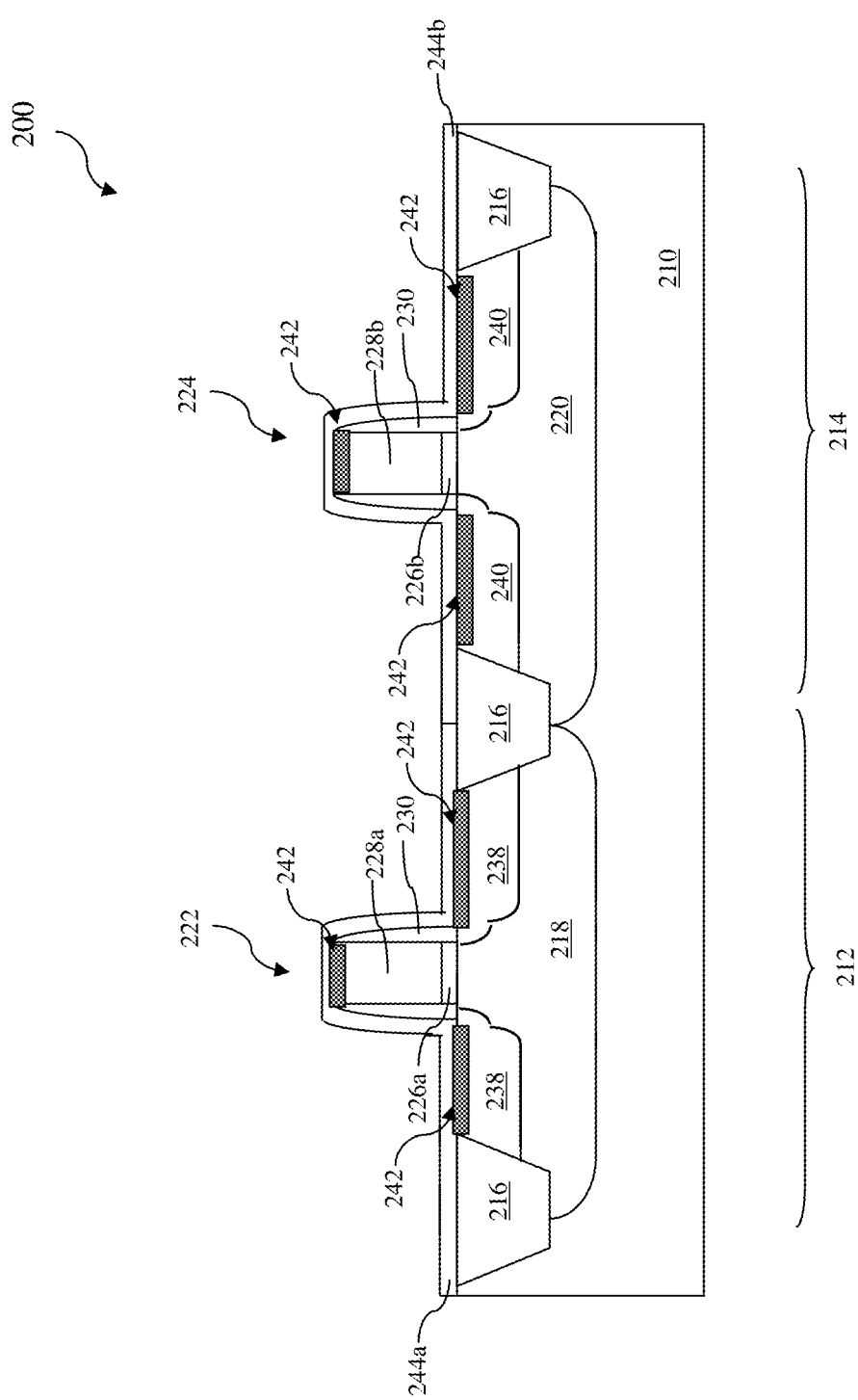

Referring to FIG. 3, the method 100 proceed to step 110 by forming a contact etch stop layer (CESL) 244 on the substrate 210. The contact etch stop layer 244 is stressed and is therefore referred to as a stressed contact etch stop layer. The contact etch stop layer 244 is individually tuned for the pFET in the first region 212 and the nFET in the second region 214 for enhanced carrier mobility in the respective (n-type or p-type) channel. In the present embodiment, the contact etch stop layer 244 includes a first portion in the first region 212 with a first tress tuned to be compressive, therefore referred to as a compressive contact etch stop layer (C-CESL) 244a. The contact etch stop layer 244 includes a second portion in the second region 214 with a second tress tuned to be tensile, therefore referred to as a tensile contact etch stop layer (T-CESL) 244b. The CESL 244 includes a dielectric material chosen to have etch selectivity for proper etch process at subsequent stages to form contact holes. The CESL 244 may be conformal to the surface profile of the substrate 210 such that it substantially covers various features on the substrate 210. In the present embodiment, the CESL 244 includes silicon nitride (SiN). In one example, the CESL 244 includes thickness ranging between about 200 angstrom and about 400 angstrom. In another example, the CESL 244 is deposited by chemical vapor deposition (CVD) with proper precursor. Particularly, the C-CESL 244a is formed by deposition, such as CVD, and the T-CESL 244b is formed by deposition and ultra-violet (UV) treatment. In the present embodiment, a silicon nitride layer is deposited (such as by CVD), then the second portion of the silicon nitride layer in the second region 214 is treated by UV to reverse the stress to be tensile.

Figure 4:
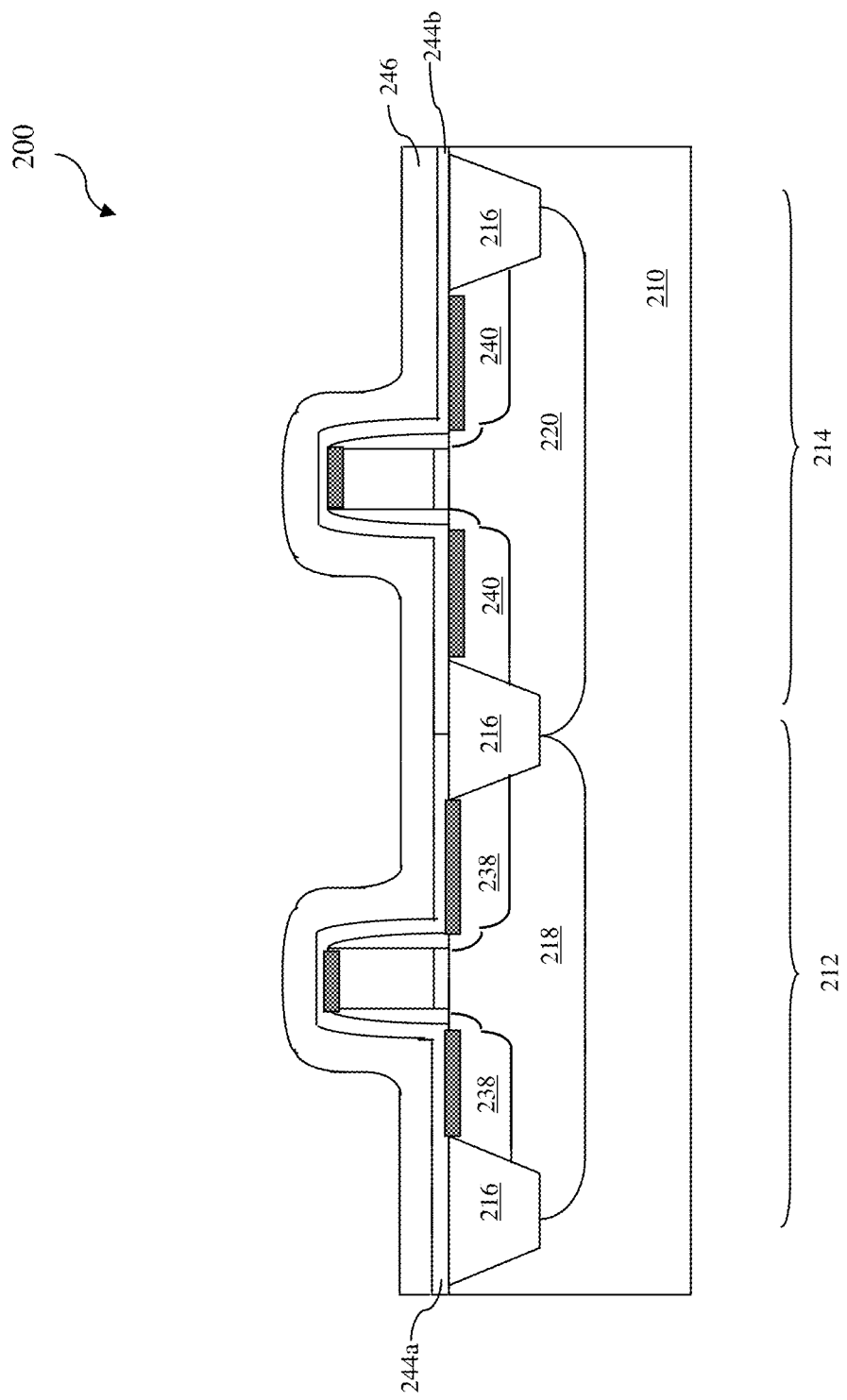

Referring to FIG. 4, the method 100 proceeds to step 112 by forming a first dielectric material layer 246. In the present embodiment, the first dielectric material layer 246 is formed by a high aspect ratio process (HARP). HARP is developed by Applied Materials, Inc. as a particular CVD technology that meets the stringent 65 nm and below, greater than 7:1 high aspect ratio gap-fill requirements. In the HARP process, a thermal process is used to reduce or eliminate the plasma damage to the device, enabling improved reliability. Further, the first dielectric material layer 246 may include a stress-tunable film that further enhance carrier mobility and device speed. In one example, the first dielectric material layer 246 includes silicon oxide. In another example, the first dielectric material layer 246 includes a thickness ranging between about 150 angstrom and about 350 angstrom.

In one embodiment, the first dielectric material layer 246 is formed by HARP with a precursor including tetraethyl orthosilicate (TEOS) and ozone (O3). As noted in the background, the tungsten string issue causes electrical shorting and product yield. It was found in our experiments and failure mode analysis that the HARP deposition rate depends on substrate characteristics including material and stress. The chemical reaction between TEOS and O3 results in ethoxysilanoles and other by-products. Then ethoxysilanoles and hydroxide (OH) group react to form silicon oxide and by-products. It was further identified that the HARP deposited first dielectric material layer 246 will have a higher deposition rate and a more rough surface on an OH-rich substrate. The surface roughness is more serious at wafer edge than wafer center. Other experiments help to identify and understand that the T-CESL 244b has more OH groups and the first dielectric material layer 246 in the second region 214 overlying the T-CESL 244b has a more rough surface including nodule defects, accordingly. The deposition temperature of the first dielectric material layer 246 is increased to be higher than about 440 C to effectively drive out the OH groups in the T-CESL layer 244b and therefore reduce the surface roughness. Thus, the hydroxide (OH) concentration of the T-CESL 244b is substantially reduced. In one example, the hydroxide concentration of the T-CESL 244b is reduced to a level substantially equal to the hydroxide concentration of the C-CESL 244a.

In another embodiment, the deposition temperature is restrained to be not higher than about 480 C since the nickel silicide features 242 will be transitioned to a high resistance phase at a temperature higher than 480 C. In one embodiment, the deposition temperature of the first dielectric material layer 246 is designed in a range between about 440 C and about 480 C. The experiments illustrate that the first dielectric material layer 246 is nodule defect free when HARP deposition temperature is tuned between about 440 C and about 480 C. In another embodiment, the deposition temperature of the first dielectric material layer 246 ranges between about 425 C and about 450 C.

Figure 5:
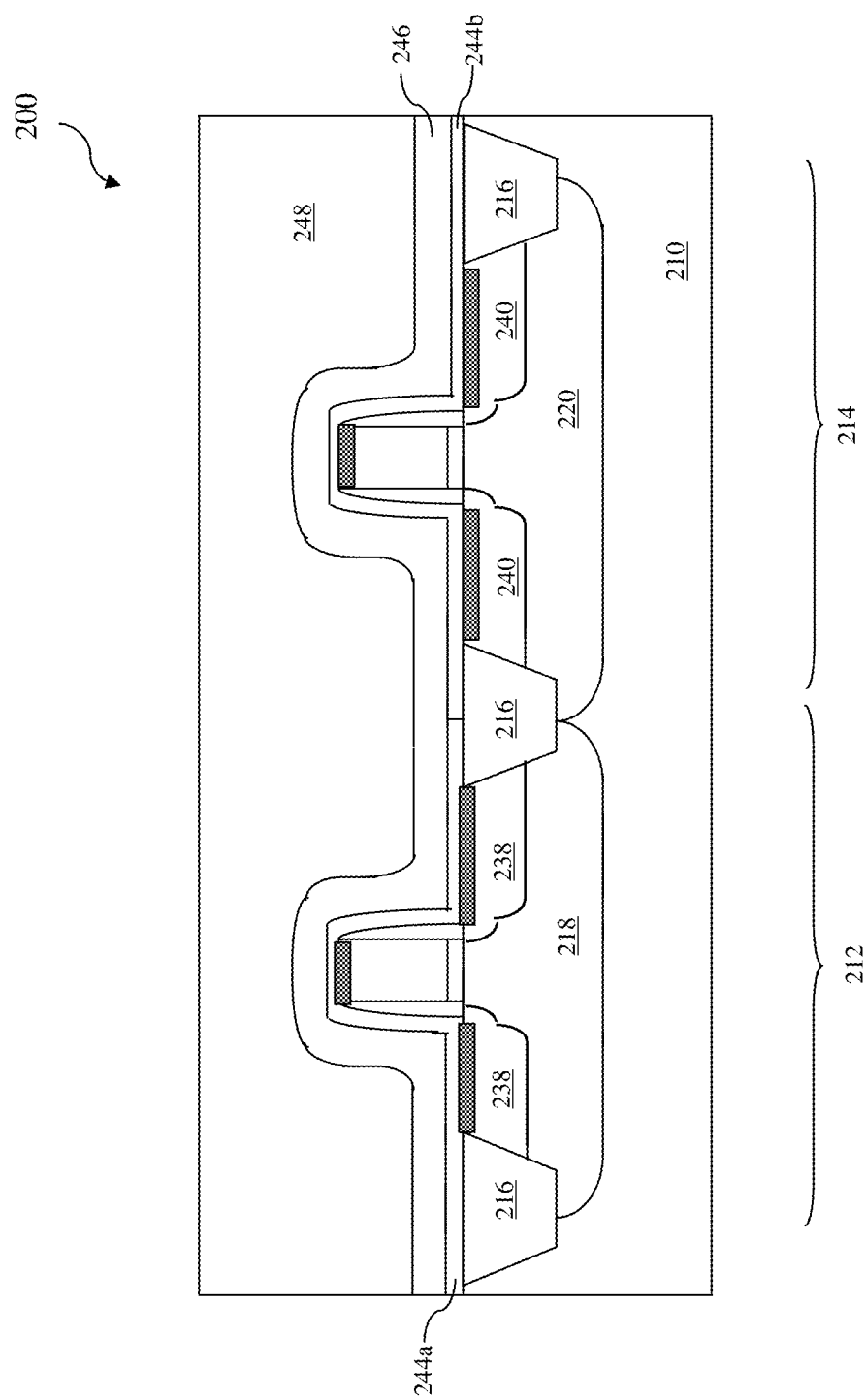

Referring to FIG. 5, the method 100 proceeds to step 114 by forming a second dielectric material layer 248. In one example, the second dielectric material layer 248 includes silicon oxide. In another example, the second dielectric material layer 248 includes a thickness ranging between about 2000 angstrom and about 3000 angstrom. The second dielectric material layer 248 is formed by a proper deposition technique, such as CVD. In the present embodiment, the second dielectric material layer 248 is deposited by high density plasma CVD (HDP-CVD). The second dielectric material layer 248 constitute at least a portion of an inter-level dielectric (ILD) layer on the substrate 210 and the gate stacks 222/224. In this example, the ILD layer further includes the first dielectric material layer 246 and the CESL 244. The ILD layer is formed on the substrate 210 to a level above the top surface of the gate stacks 222/224 such that the gate stacks 222/224 are embedded in. In other embodiments, the ILD layer may include silicon oxide, low-k dielectric material (dielectric material with dielectric constant less than about 3.9, the dielectric constant of the thermal silicon oxide), or a combination thereof.

In one embodiment, a chemical mechanical polishing (CMP) process is further applied to the ILD layer to planarize the top surface of the ILD layer. In another embodiment, the CMP process may further reduce the thickness of the ILD layer. The processing conditions and parameters of the CMP process, including slurry chemical and polishing pressure, can be tuned to partially remove and planarize the ILD layer.

Figure 6:
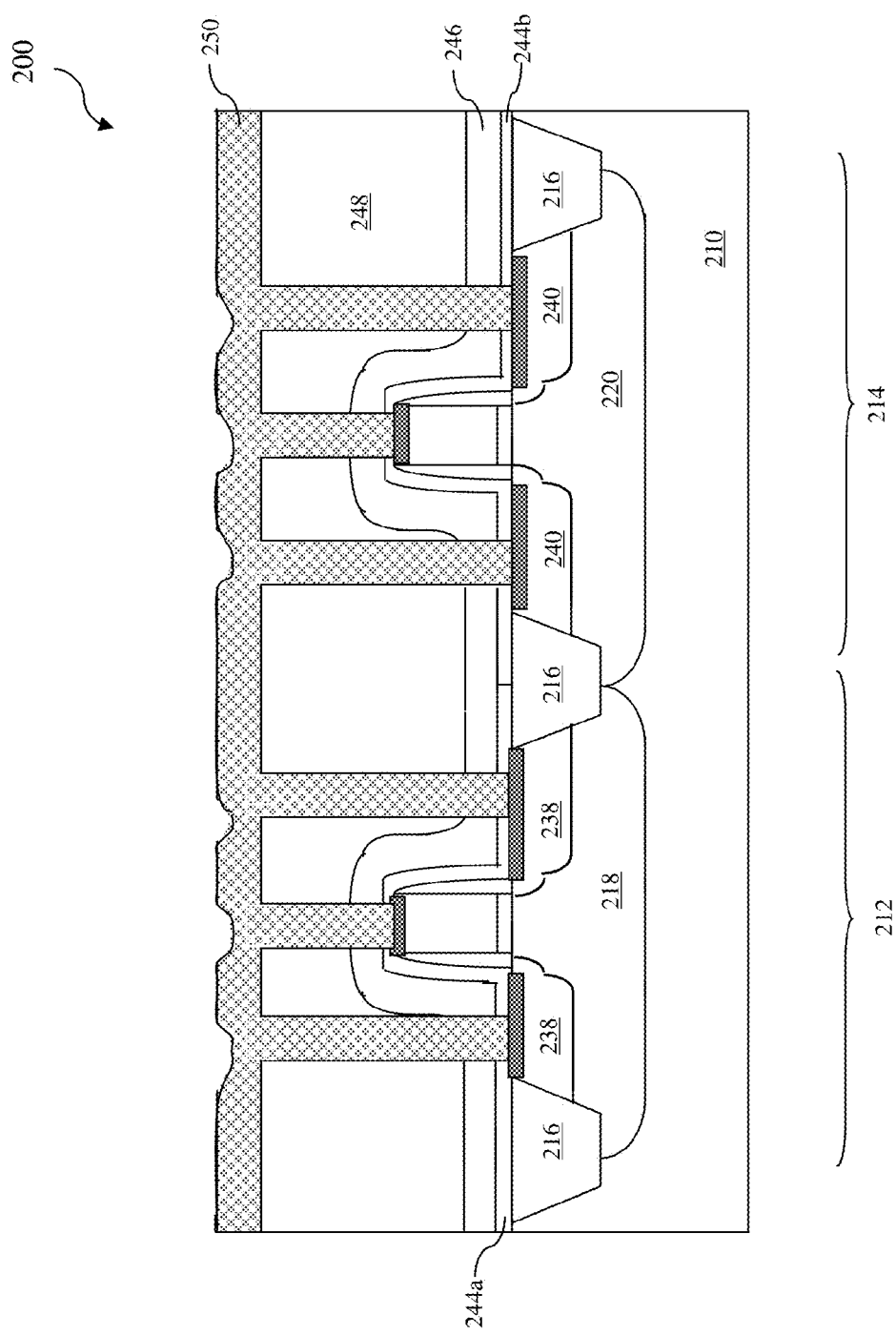

Referring to FIG. 6, the method 100 proceeds to step 116 by forming a plurality of contact holes in the ILD layer. The contact holes are aligned with various contact regions including the salicide features 246 in the first and second regions 212/214 and are extended through the ILD layer such that those contact features (e.g., salicide features 242) are exposed. In another example, a subset of the contact holes 250 may be formed and aligned with the gate stacks (e.g., 222 and 224). The contact holes are formed by a lithography process and an etching process including one or more etching steps. The etching process is applied to etch the ILD layer and to expose the contact regions. In one embodiment, the etching process includes an etch step using a plasma etch with a suitable etchant, such as fluorine-containing etchant, to selectively etch the ILD layer without damaging to the salicide features 242 in the first and second regions 212/214. In another embodiment, the etching process includes a first etch step (such as plasma etch) to etch the first and second dielectric material layers 246/248 and a second etch step using a wet etch with a suitable etchant, such as phosphorous acid, to selectively remove the CELS 244. The first etching step stops at the CESL 244 without damaging to the substrate, such as the salicide features 242. The second etching step is a short etching process, the damage to the contact features is also reduced or eliminated.

Alternatively, if a hard mask layer may be used to form the contact holes. For example, a hard mask layer, such as a silicon nitride or silicon carbide, is formed on the second dielectric material layer 248 and is further patterned to form various openings using a lithography process. The openings of the hard mask layer define regions for contact holes.

Still referring to FIG. 6, the method 100 proceeds to step 118 by filling the contact holes with a conductive material, such as one or more metal, resulting contact features or metal plugs 250. The conductive material substantially fills in the contact holes and additionally deposits on the ILD layer. In one embodiment, tungsten is used to fill in the contact holes to form tungsten plugs. Other metal, such as copper or aluminum, may be used to form metal plugs 250. The metal deposition can use CVD, physical vapor deposition (PVD), plating or combination thereof.

Figure 7:
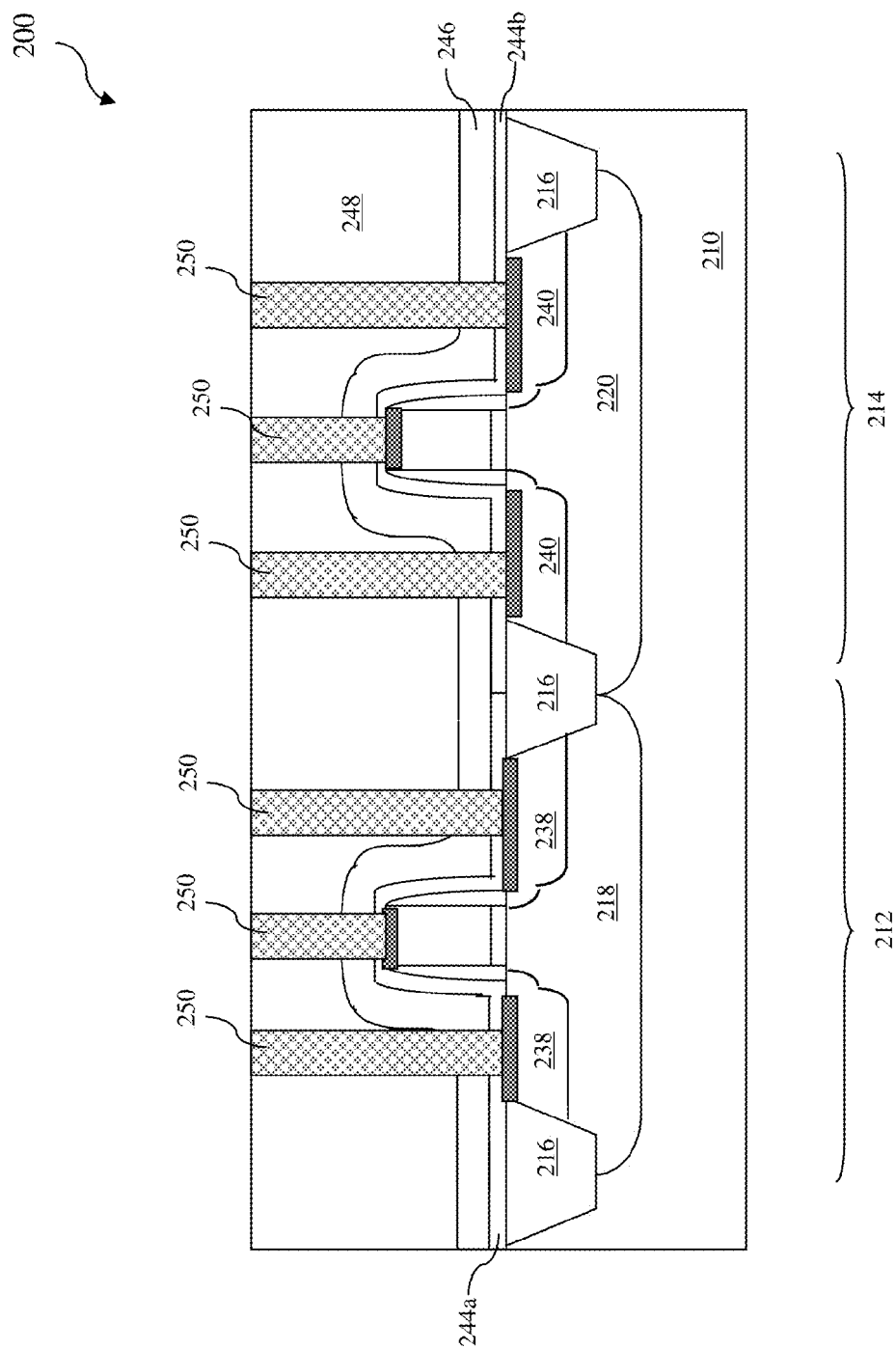

Referring to FIG. 7, the method 100 proceeds to step 120 by performing another CMP process to remove excessive conductive material formed on the ILD layer and to further planarize the top surface of the ILD layer. As the first dielectric material layer 246 is deposited by HARP with a temperature higher than about 440 C. The nodule defects are eliminated. Accordingly, the second dielectric material layer 248 is also smoother without significant dips. Accordingly, after the CMP process, the excessive conductive material (e.g., tungsten) on the ILD layer is substantially removed without significant tungsten residue on the second dielectric material layer 248, especially on the second dielectric material layer 248 in the second region 214. Accordingly, the tungsten stringer issue is reduced or eliminated.

Other process steps may be implemented before, during and/or after the method 100. For example, an interconnect structure 256 is formed on the semiconductor substrate 210 on both the first region 212 and the second region 214. The multilayer interconnection includes vertical interconnects, such as conventional vias, and horizontal interconnects, such as metal lines. The various interconnection features may implement various conductive materials including copper, tungsten and silicide. In one example, a damascene process is used to form copper related multilayer interconnection structure. The various interconnection features are coupled to the pFET and nFET in the substrate 210 through the contact plugs 250. Particularly, the various features in the interconnect structure are configured to electrically connect the gate electrodes 228b/228c, and source/drain 238/240 through the contact plugs 250.

Although embodiments of the present disclosure have been described in detail, those skilled in the art should understand that they may make various changes, substitutions and alterations herein without departing from the spirit and scope of the present disclosure. For example, the present disclosure is not limited to applications in which the semiconductor structure includes a pFET and an FET. In another example, the semiconductor structure 200 may additionally include other structure, such as a dynamic random access second (DRAM) cell, field programmable gate-array (FPGA) and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, logic cells, and others.

One or more advantages may be present in various embodiments of the present disclosure. In the existing method of forming an ILD layer, the top surface of the ILD is still uneven, resulting in tungsten residue left on the surface of the ILD after the tungsten plugs are formed in the ILD. Those tungsten defects, referred to as tungsten stringers, cause bridge issue and circuit failure, leading to reduced manufacturing yield or even zero yield. In one embodiment, by implementing the disclosed method, the ILD surface is substantially even with eliminated tungsten stringers or other conductive stringers. Accordingly, the bridging issue is eliminated or reduced, and the manufacturing yield is substantially increased.

Thus, the present disclosure provides a method of making an integrated circuit. The method includes forming a gate stack on a semiconductor substrate; forming a stressed contact etch stop layer (CESL) on the gate stack and on the semiconductor substrate; forming a first dielectric material layer on the stressed CESL using a high aspect ratio process (HARP) at a deposition temperature greater than about 440 C being able to drive out hydroxide (OH) group; forming a second dielectric material layer on the first dielectric material layer; etching to form contact holes in the first and second dielectric material layers; filling the contact holes with a conductive material; and performing a chemical mechanical polishing (CMP) process.

In one embodiment, the method further includes forming source and drain in the semiconductor substrate and interposed by the gate stack; and forming nickel silicide features on the source and drain, wherein the forming of a first dielectric material layer on the stressed CESL includes performing a HARP at a deposition temperature less than about 480 C to avoid the nickel silicide from transition to a high resistance phase. In various embodiments, the semiconductor substrate includes silicon; the forming of the second dielectric material layer includes forming the second dielectric material layer by high density plasma chemical vapor deposition (HDPCVD) and performing another CMP process to the second dielectric material layer. The stressed CESL may be a tensile stress CESL (T-CESL). The forming of a stressed CESL may include forming the T-CESL by depositing a silicon nitride (SiN) layer; and performing an ultra-violet (UV) treatment to the SiN layer. The filling of the contact holes with a conductive material may include filling the contact holes with tungsten (W), forming tungsten plugs. The source and drain may be n-type doped regions in the semiconductor substrate. In other embodiments, the forming of a first dielectric material layer includes forming a first silicon oxide layer; and the forming of a second dielectric material layer includes forming a second silicon oxide layer. The etching to form contact holes in the first and second dielectric material layers may include etching the first dielectric material layer, the second dielectric material layer and the stressed CESL.

The present disclosure also provides another embodiment of a method of making an integrated circuit. The method includes forming a first gate stack and a second gate stack on a silicon substrate; forming p-type source and drain (p-S/D) features in the silicon substrate and interposed by an n-type channel underlying the first gate stack; forming n-type source and drain (n-S/D) features in the silicon substrate and interposed by a p-type channel underlying the second gate stack; forming nickel silicide features on the n-S/D features and p-S/D features; forming a compressive contact etch stop layer (C-CESL) on the first gate stack; forming a tensile contact etch stop layer (T-CESL) on the second gate stack; and forming a first silicon oxide layer on the C-CESL and T-CESL using a high aspect ratio process (HARP) at a deposition temperature ranging between about 440 C and about 480 C.

In one embodiment, the method, after forming a first silicon oxide layer, further includes forming a second silicon layer on the first dielectric material layer by high density plasma chemical vapor deposition (HDPCVD), filling gaps between the first and second gate stacks; and performing a first chemical mechanical polishing (CMP) process to the second silicon oxide layer. In another embodiment, the method further includes etching through the first silicon oxide layer, the second silicon oxide layer, the T-CESL and the C-CESL to form contact holes therein, exposing the silicide features; filling the contact holes with tungsten; and performing a second CMP process to remove excessive tungsten on the second silicon oxide layer. In another embodiment, the forming of a compressive contact etch stop layer and the forming of a tensile contact etch stop layer include depositing a silicon nitride layer over the first and second gate stacks; and applying an ultra-violet (UV) treatment to a portion of the silicon nitride layer over the second gate stack. In yet another embodiment, the deposition temperature is higher enough to drive out hydroxide groups in the T-CESL and lower than a high-resistance phase transition temperature of nickel silicide features. The forming of a first gate stack and a second gate stack may include forming the first gate stack and the second gate stack with a lateral distance less than 800 angstrom.

The present disclosure also provides one embodiment of a semiconductor structure. The semiconductor structure includes a first gate stack and a second gate stack on a silicon substrate; p-type source and drain in the silicon substrate and interposed by an n-type channel underlying the first gate stack; n-type source and drain in the silicon substrate and interposed by a p-type channel underlying the second gate stack; nickel silicide features disposed respectively on the p-type source and drain and the p-type source and drain; a compressive contact etch stop layer (C-CESL) on the first gate stack and the p-type source and drain; a tensile contact etch stop layer (T-CESL) on the second gate stack and the n-type source and drain; an interlayer dielectric (ILD) on the C-CESL and T-CESL; and conductive plugs embedded in the ILD and contacting the nickel silicide features.

In one embodiment, the T-CESL has a reduced hydroxide concentration being substantially equal to the a hydroxide concentration of the C-CELS and the ILD includes a first silicon oxide layer on the T-CESL and C-CESL and formed by a high aspect ratio process (HARP) at a temperature greater than about 440 C to achieve the reduced hydroxide concentration; and a second silicon oxide on the first silicon oxide layer formed by high density plasma chemical vapor deposition (HDPCVD). In another embodiment, each of the T-CESL and C-CESL includes silicon nitride. In another embodiment, the first and second gate stacks are configured with a lateral distance less than about 800 angstrom. In yet another embodiment, the C-CESL and T-CESL each include a thickness less than 500 angstrom.

The present disclosure also provides another embodiment of a method of making an integrated circuit. The method includes forming a gate stack on a silicon substrate; forming source and drain in the silicon substrate and interposed by the first gate stack; forming silicide features on the source, drain and gate stack; forming a stressed contact etch stop layer (CESL) on the gate stack and on the silicon substrate; forming a first dielectric material layer on the stressed CESL using a high aspect ratio process (HARP) at a temperature between about 440 C and about 480; forming a second dielectric material layer on the first dielectric material layer by high density plasma chemical vapor deposition (HDP-CVD); performing a first chemical mechanical polishing (CMP) process to the second dielectric material layer; etching to form contact holes in the first and second dielectric material layers and exposing the silicide features; filling the contact holes with tungsten; and performing a second CMP process to remove excessive tungsten on the second dielectric material layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making an integrated circuit, the method comprising:
    forming a first gate stack and a second gate stack on a semiconductor substrate;
    forming a first source, a first drain, a second source, and a second drain in the semiconductor substrate, wherein the first gate stack interposes the first source and the first drain and the second gate stack interposes the second source and the second drain;
    forming a stressed contact etch stop layer (CESL) over the first gate stack and the second gate stack, wherein the stressed CESL is configured to provide a tensile-stressed contact etch stop layer (T-CESL) over the first gate stack and a compressive-stressed contact etch stop layer (C-CESL) over the second gate stack, wherein a hydroxide concentration of the T-CESL is greater than a hydroxide concentration of the C-CESL;
    forming a first dielectric material layer on the stressed CESL using a high aspect ratio process (HARP), wherein the HARP process is tuned to reduce the hydroxide concentration of the T-CESL;
    forming a second dielectric material layer on the first dielectric material layer;
    etching to form contact holes in the first and second dielectric material layers;
    filling the contact holes with a conductive material; and
    performing a chemical mechanical polishing (CMP) process.

2. The method of claim 1, wherein:
    the semiconductor substrate includes silicon; and
    the forming of the second dielectric material layer includes forming the second dielectric material layer by high density plasma chemical vapor deposition (HDP-CVD) and performing another CMP process to the second dielectric material layer.

3. The method of claim 1, wherein the forming of the stressed CESL includes:
    depositing a layer that includes silicon nitride over the first gate stack and the second gate stack; and
    performing an ultra-violet (UV) treatment to the layer that includes silicon nitride over the first gate stack.

4. The method of claim 1, wherein the filling of the contact holes with a conductive material includes filling the contact holes with tungsten (W), forming tungsten plugs.

5. The method of claim 1, wherein the first source and the first drain are n-type doped regions in the semiconductor substrate, and the second source and the second drain are p-type doped regions.

6. The method of claim 1, wherein:
    the forming of the first dielectric material layer includes forming a first silicon oxide layer; and
    the forming of the second dielectric material layer includes forming a second silicon oxide layer.

7. The method of claim 1, wherein the etching to form contact holes in the first and second dielectric material layers includes etching the first dielectric material layer, the second dielectric material layer, and the stressed CESL.

8. The method of claim 1, wherein a temperature of the HARP process is tuned to reduce the hydroxide concentration of the T-CESL to be substantially equal to the hydroxide concentration of the C-CESL.

9. A method of making an integrated circuit, the method comprising:
    forming a first gate stack and a second gate stack on a substrate, wherein the first gate stack is disposed in a first region and the second gate stack is disposed in a second region;
    forming p-type source and drain (p-S/D) features in the substrate and interposed by an n-type channel underlying the first gate stack;
    forming n-type source and drain (n-S/D) features in the substrate and interposed by a p-type channel underlying the second gate stack;
    forming nickel silicide features on the n-S/D features and p-S/D features;
    forming a compressive contact etch stop layer (C-CESL) over the first region, wherein the C-CESL is disposed on the first gate stack;
    forming a tensile contact etch stop layer (T-CESL) over the second region, wherein the T-CESL is disposed on the second gate stack, and further wherein the T-CESL interfaces with the C-CESL; and performing a high aspect ratio process (HARP) to deposit a dielectric material over the C-CESL and the T-CESL, wherein the HARP process is tuned to provide a deposition rate of the dielectric material over the T-CESL that is substantially equal to a deposition rate of the dielectric material over the C-CESL, thereby forming a first dielectric layer that has a surface roughness substantially the same over the C-CESL.

10. The method of claim 9, after forming the first dielectric layer, further comprising:
forming a second dielectric layer on the first dielectric layer by high density plasma chemical vapor deposition (HDPCVD), filling gaps between the first and second gate stacks; and
performing a first chemical mechanical polishing (CMP) process to the second dielectric layer.

11. The method of claim 10, further comprising:
etching through the first dielectric layer, the second dielectric layer, the T-CESL, and the C-CESL to form contact holes therein that expose the nickel silicide features;
filling the contact holes with tungsten; and
performing a second CMP process to remove excessive tungsten on the second dielectric layer, wherein the second dielectric layer is free of tungsten residue.

12. The method of claim 9, wherein the forming of the compressive contact etch stop layer and the forming of the tensile contact etch stop layer includes:
depositing a silicon nitride layer over the first region and the second region; and
applying an ultra-violet (UV) treatment to a portion of the silicon nitride layer over the second region.

13. The method of claim 9, wherein:
a temperature of the HARP process is set to reduce a hydroxide concentration of the T-CESL while preventing transition of the nickel silicide features to a high-resistance phase.

14. The method of claim 6, wherein the forming of the first gate stack and the second gate stack includes forming the first gate stack and the second gate stack with a lateral distance less than 800 angstroms.

15. A method of fabricating a device, the method comprising:
receiving a substrate having a first region and a second region;
forming a contact etch stop layer (CESL) over the substrate in the first region and the second region, wherein the CESL includes a first portion having a first hydroxide concentration and a second portion having a second hydroxide concentration, wherein the first hydroxide concentration is greater than the second hydroxide concentration; and
forming a first dielectric material layer on the CESL using a high aspect ratio process (HARP), the forming of the first dielectric material layer being configured to reduce the first hydroxide concentration of the first portion.

16. The method of claim 15, wherein a top surface of the first dielectric material layer is substantially even and free of nodule defects, the method further comprising:
forming a second dielectric material layer over the first dielectric material layer;
forming contact holes extending through the first dielectric material layer and the second dielectric material layer, the contact holes exposing a contact feature of the gate structure;
depositing a conductive material within the contact holes; and
performing a chemical mechanical polishing (CMP) process, wherein a top surface of the second dielectric material layer is free of the conductive material.

17. The method of claim 15, wherein the forming of the first dielectric material layer includes using a deposition temperature greater than about 440° C.

18. The method of claim 15, further comprising forming nickel silicide features over the substrate, wherein the forming of the first dielectric material layer is further configured to perform the HARP at a deposition temperature that reduces the first hydroxide concentration of the first portion while preventing the nickel silicide from transitioning to a high resistance phase.

19. The method of claim 15, wherein the forming of the CESL includes tuning the first portion as a compressive contact etch stop layer (C-CESL) and tuning the second portion as a tensile contact etch stop layer (T-CESL).

20. The method of claim 15, wherein the forming of the first dielectric material reduces the first hydroxide concentration of the first portion to be substantially equal to the second hydroxide concentration of the second portion.

* * * * *